US009685717B2

(12) United States Patent
Warwick et al.

(10) Patent No.: US 9,685,717 B2
(45) Date of Patent: Jun. 20, 2017

(54) APPARATUS AND METHOD FOR A CONDUCTIVE ELASTOMER ON A COAXIAL CABLE OR A MICROCABLE TO IMPROVE SIGNAL INTEGRITY PROBING

(71) Applicants: Thomas P. Warwick, Melbourne, FL (US); James V. Russell, New Hope, PA (US)

(72) Inventors: Thomas P. Warwick, Melbourne, FL (US); James V. Russell, New Hope, PA (US)

(73) Assignee: R+D Sockets, Inc., Allentown, PA (US)

( * ) Notice: Subject to any disclaimer, the term of this patent is extended or adjusted under 35 U.S.C. 154(b) by 0 days.

(21) Appl. No.: 14/512,705

(22) Filed: Oct. 13, 2014

(65) Prior Publication Data

US 2015/0027749 A1 Jan. 29, 2015

Related U.S. Application Data

(63) Continuation-in-part of application No. 13/385,914, filed on Mar. 14, 2012, now abandoned.

(51) Int. Cl.
*H05K 1/03* (2006.01)
*H01R 11/18* (2006.01)
(Continued)

(52) U.S. Cl.
CPC ............... *H01R 11/18* (2013.01); *H01R 9/05* (2013.01); *H01R 13/2414* (2013.01);
(Continued)

(58) Field of Classification Search
CPC .. G01R 1/07342; G01R 1/06711; G01R 3/00; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393; H05K 1/05; H05K 1/11; H05K 1/117; H05K 1/119; H05K 1/14; H05K 1/142; H05K 2201/09872; H05K 2201/10378; H05K 3/4602; H05K 3/4691; H05K 1/09; H05K 1/092; H05K 1/095; H05K 1/097;
(Continued)

(56) References Cited

U.S. PATENT DOCUMENTS 4,678,865 A 7/1987 Sherwin
5,477,159 A 12/1995 Hamling
(Continued)

*Primary Examiner* — Angel R Estrada
*Assistant Examiner* — Pete Lee
(74) *Attorney, Agent, or Firm* — Richard B. Klar, Esq.; Law Office Richard B. Klar

(57) ABSTRACT

A method and structure for improving signal integrity probing. A coaxial or a microcoaxial cable is threaded through an optional alignment substrate where the cable is used to support or align the cable or an array of cables. A conductive elastomer is placed on a cable or a microcoaxial cable to improve signal integrity probing.

18 Claims, 3 Drawing Sheets

(51) Int. Cl.
*H01R 13/24* (2006.01)
*H01R 9/05* (2006.01)

(52) U.S. Cl.
CPC ..... *H01R 2201/20* (2013.01); *Y10T 29/49123* (2015.01); *Y10T 29/49895* (2015.01)

(58) Field of Classification Search
CPC ....... H05K 2201/0133; H05K 2201/02; H05K 2201/0203; H05K 2201/0206; H01R 11/18; H01R 13/2414; H01R 9/05; H01R 29/49123; H01R 2201/20; Y10T 29/49895
USPC .............................. 174/255–266; 324/755.01
See application file for complete search history.

(56) References Cited

U.S. PATENT DOCUMENTS

| | | | | |
|---|---|---|---|---|
| 5,959,514 | A | 9/1999 | Smith et al. | |
| 6,495,938 | B2 | 12/2002 | Naito et al. | |
| 6,707,311 | B2 * | 3/2004 | Hohenwarter | 324/754.2 |
| 6,802,720 | B2 * | 10/2004 | Weiss et al. | 439/66 |
| 7,310,455 | B2 * | 12/2007 | Yakymyshyn | G02F 1/035 359/256 |
| 7,423,439 | B2 * | 9/2008 | Kasukabe | G01R 1/0735 324/755.05 |
| 7,815,466 | B2 * | 10/2010 | Yaghmai et al. | 439/581 |
| 8,026,733 | B2 * | 9/2011 | Lee | G01R 1/07378 324/754.01 |
| 2007/0018190 | A1 * | 1/2007 | Kim et al. | 257/99 |

* cited by examiner

APPARATUS AND METHOD FOR A CONDUCTIVE ELASTOMER ON A COAXIAL CABLE OR A MICROCABLE TO IMPROVE SIGNAL INTEGRITY PROBING

RELATED APPLICATION

The present application is a continuation in part application of U.S. patent application Ser. No. 13/385,914 filed on Mar. 14, 2012 and claims priority thereunder pursuant to 37 CFR 1.120.

BACKGROUND

1. Field

The present disclosure relates to an apparatus and a method for improving signal integrity probing. In particular, the present disclosure provides for improving signal integrity probing by providing a conductive elastomer on a cable or a microcoaxial cable.

2. The Related Art

Signal integrity probing requires good electrical connections. However there are problems that prevent good electrical connections from being formed with the contact surface to be probed. The contact surface that is the subject of the probing may typically have oxides, oils or debris formed on its surface. Such deposits will make it difficult if not impossible to effect a good probing contact and thus impair a good electrical connection. It would be desirable to effect good electrical connections for improved signal integrity probing.

SUMMARY

It would be desirable to provide a method and structure for improving signal integrity that avoids the drawbacks of the aforementioned problems. This is accomplished by providing a method and structure for improving signal integrity probing by threading a coaxial or microcoaxial cable, having a conductive elastomer, thereon through an optional alignment substrate where the cable is used to support or align the cable or an array of cables.

DETAILED DESCRIPTION OF THE PREFERRED EMBODIMENT(S)

Figure 1:
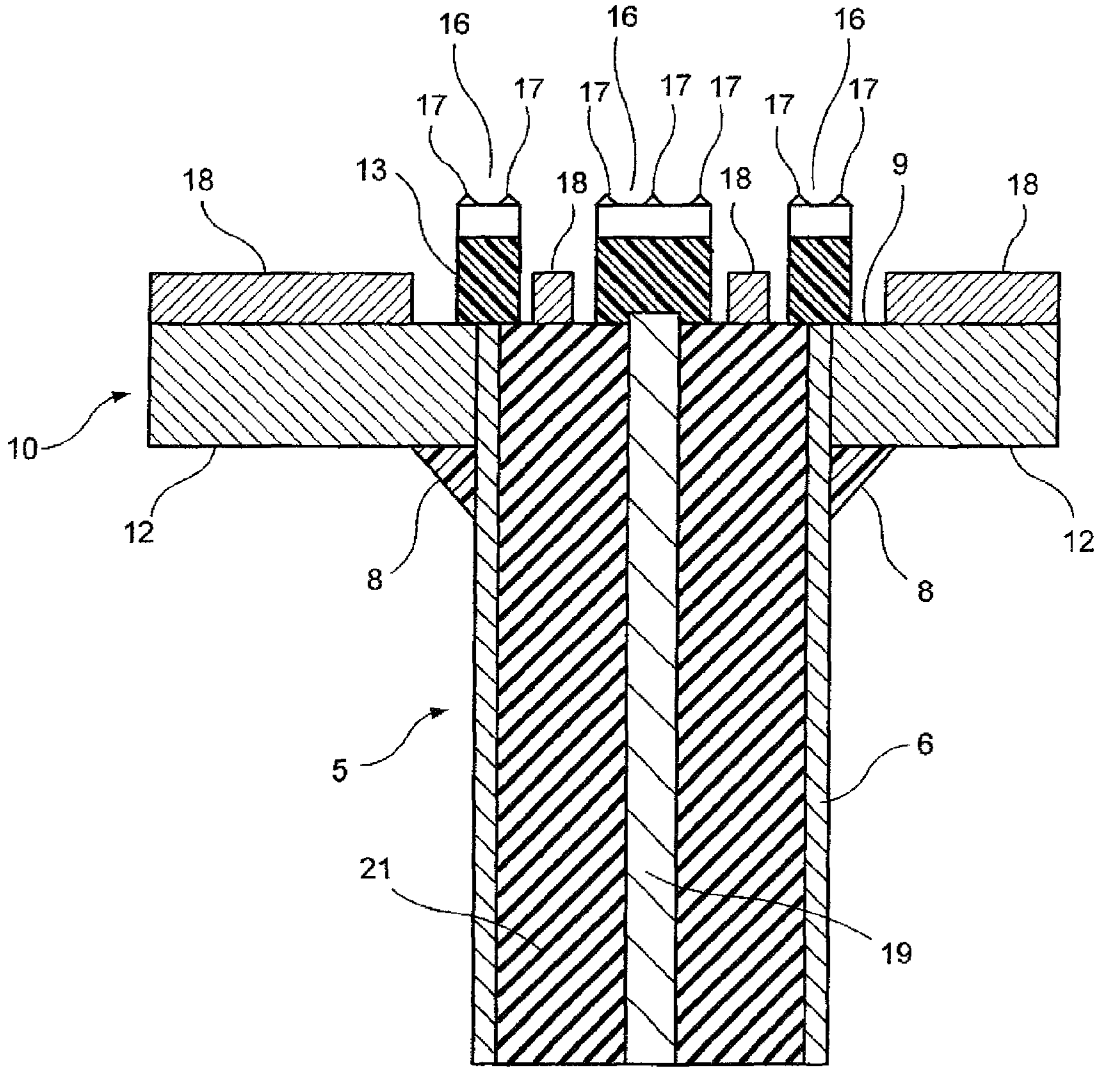
FIG. 1 is a sectional view of a first embodiment of the present disclosure in which a coaxial or micro coaxial cable extends through an alignment substrate (which can be either a conductive or non-conductive substrate) and conductive elastomers are provided to the center conductor region in a column near where the shield of the cable and the top surface of the substrate meet.

The present application incorporates the subject matter of patent application Ser. No. 13/815,737 filed on Mar. 15,2013 by reference thereto. The substrate 10 is preferably formed as either an electrically conductive metal or as an insulator. The cable 5 has an outer metallic shell 6. The metallic shell 6 remains in intimate contact with the substrate 10 and is preferably soldered 8 to provide good electrical connection.

The cable 5 has a top side 8 that is preferably flush with the top side 9 of the substrate 10. The cable 5 has a bottom side 11 that is preferably flush with a bottom side 12 of the substrate 10 or extends outward from the bottom side 12 of the substrate 10 (as shown in FIG. 1) and is free to accept a traditional connector or can be attached to an electronic assembly through any conventional techniques known in the art.

Figure 2:
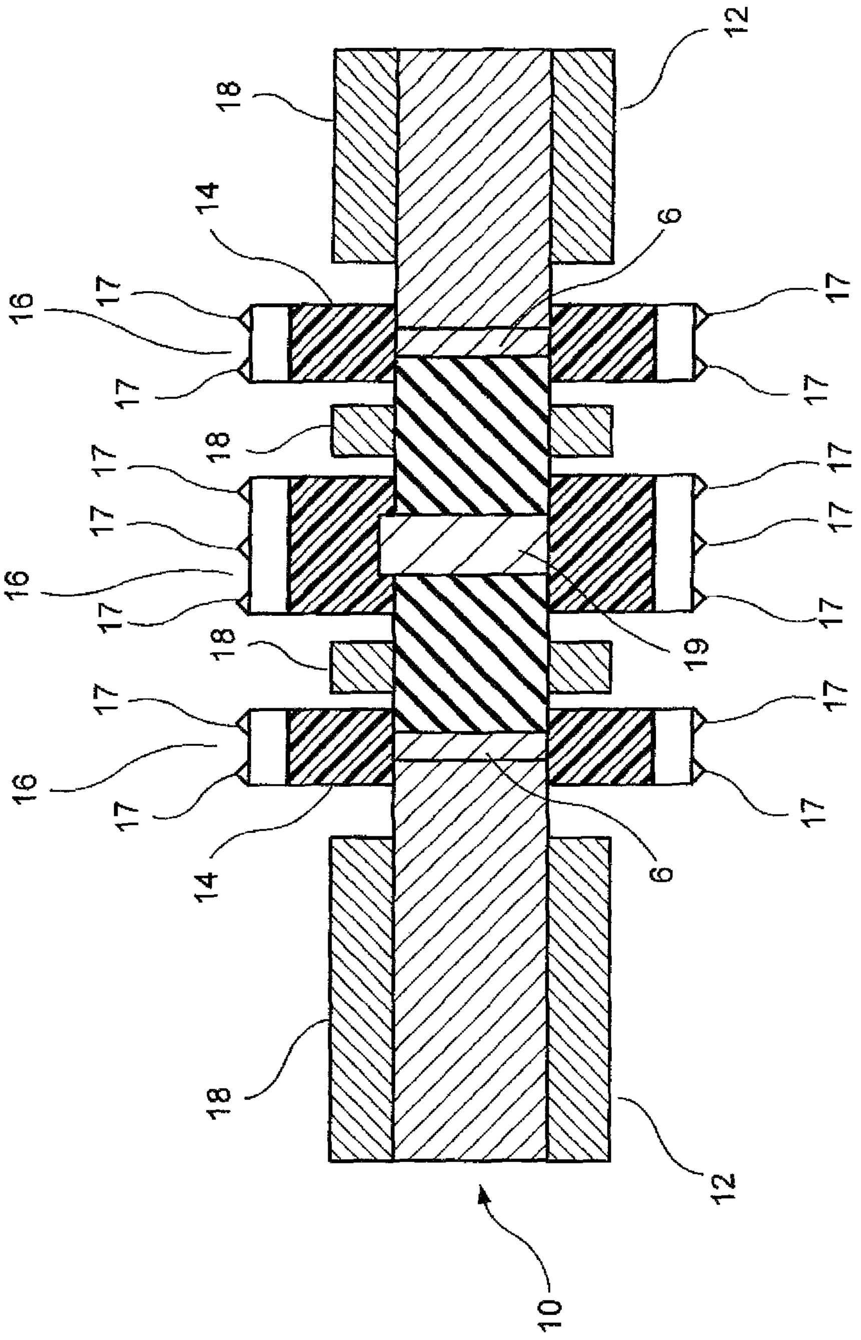
FIG. 2 is a sectional view of a second embodiment of the present disclosure in which a coaxial or micro coaxial cable extends through an alignment substrate (which can be either a conductive or non-conductive substrate) and conductive elastomers are provided to the center conductor region in a column near where the shield of the cable and the top surface of the substrate meet and also applied to the bottom side of the substrate.

As seen in FIG. 1, a conductive elastomer 13 is applied to the center conductor region 19 (insulated from outer coaxial cables by coaxial dielectic 21) in a column 14. This conductive elastomer 13 is preferably applied in the ground shielding region 15 where the shield of the cable 5 and the top surface 9 of the substrate 10 meet. These conductive elastomeric regions are preferably isolated from each other in order to prevent electrical shorting (as shown in FIGS. 1 and 2). Optionally a nonconductive substrate can be applied in the open areas on top 9 of the substrate 10 around the conductive elastomers 13 close enough to provide room for the elastomer 13 to expand when it is compressed (as seen in FIG. 1 with compression stops 18) but will prevent it from over compression and damage. In FIG. 1 a low contact resistance metal can be employed to form a pad 16 having sharp points or “aspirates” 17 that are formed on top 9 of the substrate 10 to help penetrate oxides, oils of debris that may form on the subject contact point that is intended to be probed.

As in FIG. 1, FIG. 2 illustrates a method and apparatus in which a low contact resistance metal can be employed to form a pad 16 having sharp points or “aspirates” 17 that are formed on top 9 of the substrate 10 to help penetrate oxides, oils or debris that may form on the subject contact point that is intended to be probed. In addition in the embodiment of FIG. 2 this same structure and method for the top side 9 of the substrate 10 can also be used for the bottom side 12 of the substrate 10 to provide for a high speed, high band width connector.

Figure 3:
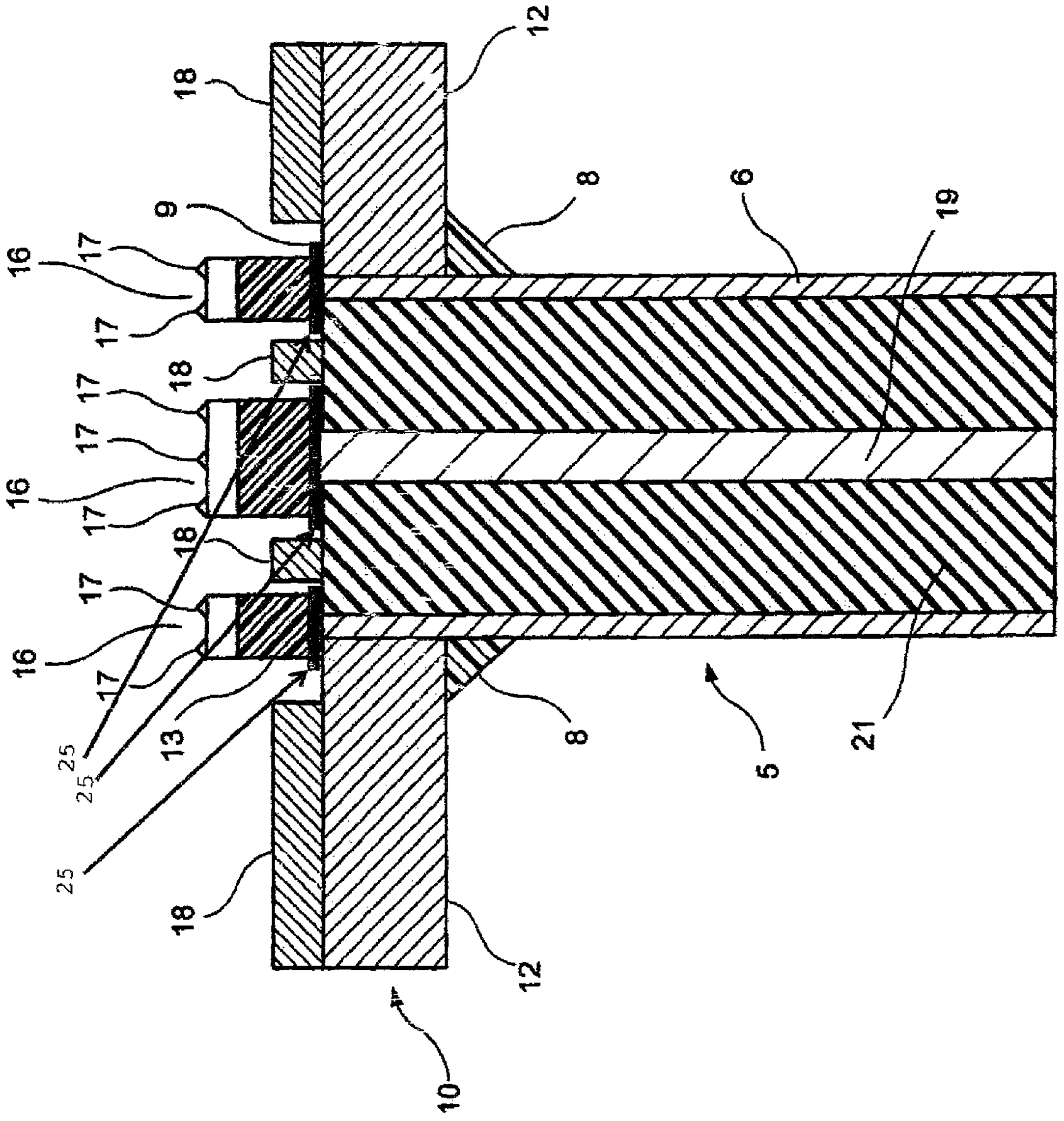
FIG. 3 is another embodiment of the present disclosure in which an elastomer is mounted on a conductive disc 25 which is placed into contact with the central conductor region of a coaxial or microcoaxial cable.

FIG. 3 illustrates another embodiment of the present disclosure. In FIG. 3 the conductive elastomer 13 can preferably be affixed onto an electrically conductive metallic disc 25 that is placed in fixed contact with a center conductor region 19 of at least one of the coaxial or microcoaxial cables 5 as described in the patentee’s pending patent application Ser. No. 13/815,737 filed on Mar. 15, 2013 which is incorporated by reference thereto. The conductive disc 25 can be preferably a metallic disc 25. For an array of coaxial cables or microcables 5 a similar embodiment is possible with elastomers 13 mounted on conductive discs 25 that are placed in contact with each central conductor region 18 for each of the cables or microcables 5.

While presently preferred embodiments have been described for the purposes of the disclosure, it is understood that numerous changes in the arrangement of apparatus parts can be made by those skilled in the art. Such changes are encompassed within the spirit of the invention as defined by the appended claims.

The invention claimed is:

1. A method for improving signal integrity probing, the steps comprising: threading one or more coaxial cables or microcoaxial cables through one or more optional alignment substrates, respectively wherein said one or more optional alignment substrates support or align the one or more cable or an array of cables; separately placing a first grounding pin connected to a ground layer having its own conductive elastomeric coating thereon, said grounding pin being affixed on top of one of one or more an electrically conductive disc formed as a metallic disc isolated from other pins having conductive elastomeric coatings thereon and separately placing a central coaxial conductive pin having a conductive elastomeric coating thereon, said central coaxial pin being affixed on top of one of one or more said electrically conductive discs formed as a metallic disc, said central coaxial conductive pin being isolated from other pins having conductive elastomeric coatings thereon and separately placing another of said grounding pins connected to the ground layer having its own conductive elastomeric coating thereon and improving signal integrity probing by separately placing at least one or more one conductive elastomeric pin to be affixed on top of one or more electrically conductive discs formed as metallic discs isolated from another of said conductive elastomeric pins placed on another of said metallic discs so that each of said conductive elastomeric pins are is placed in fixed contact with at least one of a center conductive region of said one or more cables or said microcoaxial cables so that by isolating said conductive elastomeric regions from each other it prevents electrical shorting and improves signal integrity probing.

2. The method for improving signal integrity probing according to claim 1 further comprising forming a pad with a low contact resistance metal, said pad having sharp points or "aspirates" formed on top to help penetrate oxides, oils of debris that may form on the subject contact point that is intended to be probed.

3. The method according to claim 2 further comprising forming another pad with a low contact resistance metal having sharp points or "aspirates" formed on a bottom side of said substrate to provide for a high speed, high band width connector.

4. An apparatus for improving signal integrity probing, comprising:

one or more coaxial cables or microcoaxial cables threaded through one or more optional alignment substrates, respectively wherein said optional alignment substrates support or align the one or more cable or an array of cables: separately placing a first grounding pin connected to a ground layer having its own conductive elastomeric coating thereon, said grounding pin being affixed on top of one of one or more an electrically conductive disc formed as a metallic disc isolated from other pins having conductive elastomeric coatings thereon and separately placing a central coaxial conductive pin having a conductive elastomeric coating thereon, said central coaxial pin being affixed on top of one of one or more said electrically conductive discs formed as a metallic disc, said central coaxial conductive pin being isolated from other pins having conductive elastomeric coatings thereon and separately placing another of said grounding pins connected to the ground layer having its own conductive elastomeric coating thereon and separately placing one or more conductive elastomeric pins separately placed for affixing on top of one or more electrically conductive discs formed as a metallic disc isolated from another of said conductive elastomeric pins placed on another said metallic discs so that each of said conductive elastomeric pins are in fixed contact with at least one of a center conductive region of said one or more cables or said microcoaxial cables so that by isolating said conductive elastomeric regions from each other it prevents electrical shorting and improves signal integrity probing.

5. The apparatus for improving signal integrity probing according to claim 4 wherein said conductive elastomeric coating is placed near a top surface of said substrate.

6. The apparatus for improving signal integrity probing according to claim 4 wherein said conductive elastomeric coating is applied to the center conductor region in a column.

7. The apparatus for improving signal integrity probing according to claim 6 said conductive elastomeric coating is applied in a ground shielding region where the shield of the cable and the top surface of the optional alignment substrate meet.

8. The apparatus for improving signal integrity probing according to claim 4 wherein said optional alignment substrate is formed as an electrically conductive metal.

9. The apparatus for improving signal integrity probing according to claim 4 wherein said optional alignment substrate is formed as an insulator.

10. The apparatus for improving signal integrity probing according to claim 4 wherein said cable has an outer metallic shell that is placed firmly in intimate contact with said optional alignment substrate to ensure good electrical connection.

11. The apparatus for improving signal integrity probing according to claim 7 wherein said outer metallic shell is soldered to said optional alignment substrate to ensure good electrical connection.

12. The apparatus for improving signal integrity probing according to claim 4 wherein said cable has a top side that is flush with a top of said optional alignment substrate.

13. The apparatus for improving signal integrity probing according to claim 4 wherein said cable has a bottom side of the cable that is flush to the bottom side and is free to accept a traditional connector.

14. The apparatus for improving signal integrity probing according to claim 4 wherein said cable has a bottom that extends outward and can be free to accept a traditional connector.

15. The apparatus for improving signal integrity probing according to claim 4 further comprising low contact resistance metal forms a pad with sharp points or "aspirates" formed on top to help penetrate oxides, oils of debris that may form on the subject contact point that is intended to be probed.

16. The apparatus for improving signal integrity probing according to claim 15 wherein a low contact resistance metal forms another pad with sharp points or "aspirates" formed on a bottom side of said substrate to provide for a high speed, high band width connector.

17. A method for improving signal integrity probing, the steps comprising: threading one or more coaxial cables or microcoaxial cables through one or more optional alignment substrates, respectively wherein said one or more optional alignment substrates support or align the one or more cable or an array of cables; and improving signal integrity probing by separately placing a first grounding pin connected to a ground layer having its own conductive elastomeric coating thereon, said grounding pin being affixed on top of one of one or more an electrically conductive disc formed as a metallic disc isolated from other pins having conductive elastomeric coatings thereon and separately placing a central coaxial conductive pin having a conductive elastomeric coating thereon, said central coaxial conductive pin being affixed on top of one or more said electrically conductive discs each of which are formed as a metallic disc, said central coaxial conductive pin being isolated from other pins having conductive elastomeric coatings thereon and separately placing another of said grounding pins connected to the ground layer having its own conductive elastomeric coating thereon, said grounding pin being affixed on top of one of one or more an electrically conductive disc formed as a metallic disc isolated from other pins having conductive elastomeric coatings thereon so that each of said grounding and central coaxial conductive elastomeric pins are placed in fixed contact with at least one of a center conductive region of said one or more cables cable or said microcoaxial cables so that by isolating said conductive elastomeric coating regions from each other it prevents electrical shorting and improves signal integrity probing.

18. A method for improving signal integrity probing, the steps comprising: threading one or more coaxial cables or microcoaxial cables through one or more optional alignment substrates, respectively wherein said optional alignment substrates support or align the one or more cables or an array of cables; and improving signal integrity probing by separately placing a first grounding pin connected to a ground layer having its own elastomeric coating thereon, said grounding pin being affixed on top of one of one or more an electrically conductive disc formed as a metallic disc isolated from other pins having elastomeric coatings thereon and separately placing a central coaxial conductive pin having an elastomeric coating thereon, said central coaxial pin being affixed on top of one of one or more said electrically conductive discs formed as a metallic disc, said coaxial pin being isolated from other pins having elastomeric coatings thereon and separately placing another of said grounding pins connected to the ground layer having its own elastomeric coating thereon, said grounding pin being affixed on top of one or more electrically conductive discs each of which are formed as a metallic disc isolated from other pins having elastomeric coatings thereon so that each of said grounding and central coaxial elastomeric pins are placed in fixed contact with at least one of a center conductive region of said one or more cables cable or said microcoaxial cables so that by isolating said elastomeric regions from each other it prevents electrical shorting and improves signal integrity probing.

* * * * *